(12) United States Patent
Otsuka et al.

(10) Patent No.: US 7,186,620 B2
(45) Date of Patent: Mar. 6, 2007

(54) METHOD OF MAKING SUBSTRATES FOR NITRIDE SEMICONDUCTOR DEVICES

(75) Inventors: Koji Otsuka, Niiza (JP); Junji Sato, Niiza (JP); Tomoya Sugahara, Niiza (JP)

(73) Assignee: Sanken Electric Co., Ltd. (JP)

( * ) Notice: Subject to any disclaimer, the term of this patent is extended or adjusted under 35 U.S.C. 154(b) by 280 days.

(21) Appl. No.: 10/995,446

(22) Filed: Nov. 23, 2004

(65) Prior Publication Data

US 2005/0118752 A1    Jun. 2, 2005

(30) Foreign Application Priority Data

Nov. 28, 2003    (JP)    ............................. 2003-398669

(51) Int. Cl.
*H01L 21/336*    (2006.01)
(52) U.S. Cl. ...................................... 438/285
(58) Field of Classification Search ................ 438/285
See application file for complete search history.

(56) References Cited

FOREIGN PATENT DOCUMENTS

| JP | 10-312971 | 11/1998 |
|----|-----------|---------|
| JP | 2002-343728 | 11/2002 |
| JP | 2003-059948 | 2/2003 |

*Primary Examiner*—Carl Whitehead, Jr.
*Assistant Examiner*—Monica D. Harrison
(74) *Attorney, Agent, or Firm*—Woodcock Washburn LLP (57) ABSTRACT

For fabricating an LED substrate with minimal dislocations in its nitride semiconductor layers, GaN is epitaxially grown into a first formative layer overlying a multilayered buffer region on a silicon substrate. A second formative layer is then formed on the first formative layer by epitaxially growing AlN, at such a rate that interstices are created in the first formative layer by the etching action of the reactor gases in the early stages of the fabrication of the second formative layer. Then the second formative layer is etched away from over the intersticed first formative layer, leaving the interstices open. Then a filler layer of GaN is epitaxially grown on the intersticed first formative layer in interfitting engagement therewith. Dislocations are greatly reduced in active semiconductor layers formed subsequently on the filler layer.

13 Claims, 5 Drawing Sheets

METHOD OF MAKING SUBSTRATES FOR NITRIDE SEMICONDUCTOR DEVICES

CROSS REFERENCE TO RELATED APPLICATIONS

This application claims priority to Japanese Patent Application No. 2003-398669, filed Nov. 28, 2003.

BACKGROUND OF THE INVENTION

This invention relates to a method of making semiconductor substrates for production of nitride semiconductor devices. The semiconductor substrates made by the method of the invention are currently believed to be best suited for production of light-emitting diodes (LEDs), high-electron-mobility transistors (HEMTs), and field-effect transistors (FETs), among other devices.

Nitride semiconductor devices are formed on semiconductor substrates or dice cut from a wafer. Each such substrate comprises a baseplate or substrate proper of either sapphire, silicon carbide, or silicon, and a lamination of or nitride semiconductor layers grown epitaxially on the baseplate. Of the listed baseplate materials, sapphire and silicon carbide are so expensive that silicon is now used preferentially, as taught in Japanese Unexamined Patent Publication No. 2003-59948.

There have been difficulties left unresolved with the semiconductor substrates of the prior art construction outlined above. The silicon baseplate or substrate proper and the nitride semiconductor region thereon have an inconveniently great difference in coefficient of linear expansion, such that dislocations were easy to occur in the nitride semiconductor region. Too many dislocations taking place in the nitride semiconductor region led to such deficiencies in performance as a drop in the efficiency of light emission (in the case of an LED) and a rise in current leakage.

A remedy to this problem is also found in the Japanese patent application cited above, which teaches an interposition of a multilayered buffer region between the silicon substrate and the nitride semiconductor region. Highly capable of stress mitigation, the buffer region proved conducive to the reduction of cracks and dislocations in the nitride semiconductor region.

Further reduction of dislocations have nevertheless been desired in the semiconductor and allied industries for provision of semiconductor devices of still higher performance characteristics. Japanese Unexamined Patent Publication No. 10-312971 represents a conventional approach to this objective. It proposes to grow by epitaxy a layer of a Group III–V compound semiconductor such as gallium nitride on a substrate via a patterned mask of silicon dioxide or the like. Epitaxial growth proceeds not only in a direction normal to the baseplate surface but parallel thereto as well, with the result that a flat-surfaced gallium nitride layer is grown on the masked substrate. Little or no dislocations occur in those parts of the gallium nitride layer which overlie other than the windows in the mask, so that the overall dislocation density of this layer is significantly curtailed. This approach is still unsatisfactory because of the costs and labor associated with the production of the mask.

Another approach is found in Japanese Unexamined Patent Publication No. 2002-343728, teaching to create a gallium nitride layer on a substrate proper and to cover the gallium nitride layer with a metal layer formed as by vapor deposition. Then a multiplicity of cavities are thermally created in the gallium nitride layer, and a gallium nitride layer is again grown by epitaxy. This approach is also objectionable by reason of the complex and costly method of manufacture involving use of the two different fabrication processes of epitaxy and vapor deposition.

Hereinafter in this specification the term "baseplate proper" will be used to refer to the growth substrate or substrate proper for growing semiconductors thereon. The term "baseplate system" will then refer to the combination of the baseplate and the buffer region thereon. The term "substrate system" will then refer to the combination of the baseplate, the buffer region thereon, and the main semiconductor region of one or more layers. The substrate system might also be termed a semiconductor body or wafer or chip.

SUMMARY OF THE INVENTION

The present invention seeks to provide a greatly simplified and less costly method of creating a substrate system including a nitride semiconductor region having dislocations reduced to a minimum, without the difficulties heretofore encountered in the art.

Briefly, the invention may be summarized as a method of making a substrate system of reduced dislocations to be processed into a variety of semiconductor devices. A first layer is first formed on a baseplate by growing by vapor-phase epitaxy a gallium-nitride-based compound semiconductor containing aluminum in a first proportion which is equal to or greater than zero. A second layer is then formed on the first layer by growing, also by vapor-phase epitaxy, a nitride semiconductor containing aluminum in a second proportion which is greater than the first proportion. The growth rate of the aluminum-containing nitride is so reduced that interstices are etched open in the first layer at the early stages of the fabrication of the second layer, which when fully grown closes the open ends of the interstices. Then the second layer is removed, as by gas etching, from over the first layer, reopening the interstices therein, although the second layer may partly remain on the uninterstriced parts of the first layer. Then a gallium-nitride-based compound semiconductor is grown on the first layer, or on the remaining parts of the second layer, by vapor-phase epitaxy, thereby creating a third layer in interfitting engagement with the intersticed first layer.

Particular attention may be paid to how the first layer is intersticed during the growth of the second layer aluminum-containing nitride (e.g. aluminum nitride). With its growth rate made extremely low, aluminum nitride does not crystallize uniformly, but sparsely, over the surface of the first layer, so that the exposed surface parts of the first layer are subjected to the etching action of the reactor gases. The result is the creation of interstices in the first layer through its exposed surface parts. Subsequently growing in directions both normal and parallel to the surface of the first layer, aluminum nitride will form the second layer overlying the intersticed first layer.

Thus the present invention has succeeded in creating interstices in the first layer without relying upon the masking or metal vaporizing process needed by the prior art. As the third layer is formed by vapor-phase epitaxy in mating engagement with the intersticed first layer, dislocation density is reduced in this third layer on the same principle as in the aforesaid Japanese Unexamined Patent Publication Nos. 10-312971 and 2002-343728. The fabrication of semiconductor systems having the nitride semiconductor third layer of reduced dislocations is thus made easier and less costly and time-consuming than heretofore.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION OF THE INVENTION

The method of this invention will now be described more specifically as adapted for the fabrication of the LED 1 shown in FIG. 1. FIGS. 2–7 show successive steps in the course of the fabrication of the LED 1 and will be referred to more specifically during the subsequent description of the method of making the LED. The LED 1 has an LED body or LED substrate system 2 constituting part of a wafer which is sized for joint production of a plurality or multiplicity of LEDs.

The LED substrate system 2 includes a baseplate 3 which, in combination with an overlying buffer region 4, constitutes a baseplate system 5. Overlying this baseplate system 5 are three main semiconductor layers 6, 7 and 8, arranged one on top of another in that order from the lowermost one upward. The lowermost main semiconductor layer 6 is an n-type cladding or confining layer; the intermediate main semiconductor layer 7 is an active layer; and the topmost main semiconductor layer 8 is a p-type cladding or confining layer. The additional components of the LED 1 are an anode or front electrode 9 on top of the LED substrate system 2 or of the p-type cladding 8, and a cathode or back electrode 10 on the back of the LED substrate system or of the baseplate 3.

Figure 2:
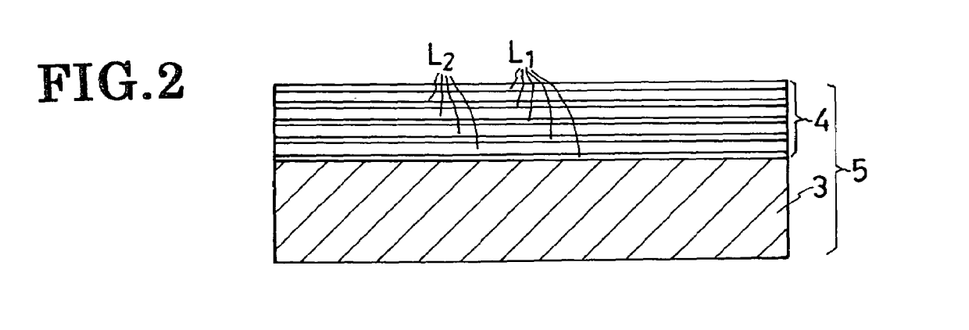
FIG. 2 is a section through the baseplate system of the LED of FIG. 1.

The fabrication of the LED substrate system 2 starts with the preparation of the baseplate system 5, shown by itself in FIG. 2, which comprises the electrically conductive silicon baseplate 3 and the buffer region 4 thereon. Notwithstanding the showing of the drawings, however, the buffer region 4 is not an absolute requirement from the standpoint of the instant invention; instead, the main semiconductor layers 6–8 could directly overlie the baseplate 3. Use of silicon as a baseplate material is also not a prerequisite. Other possible baseplate materials include silicon compounds, zinc oxide (ZnO), neodymium gallium oxide (NdGaO$_3$), gallium arsenide (GaAs), and other Groups III–V compounds, in addition to sapphire. Silicon is employed here because it is cheaper.

Preferably, the baseplate 3 is of p-type monocrystalline silicon containing boron or like Group III element as a conductivity type determinant. The major surface of this silicon baseplate 3 on which is formed the buffer region 4 is the (111) surface in terms of Miller indices. The silicon baseplate 3 has an impurity concentration ranging from $5\times10^{18}$ to $5\times10^{19}$ cm$^{-3}$, and a resistivity ranging from 0.0001 to 0.0100 ohm-centimeter. The silicon baseplate 3 is therefore electrically conductive, providing a current path in the operation of the LED 1. The silicon baseplate 3 should be sufficiently thick (e.g. from 350 to 1000 micrometers) for mechanically supporting the semiconductor regions formed thereon.

Although the p-type silicon baseplate 3 and n-type buffer region 4 are shown as being in direct contact with each other, actually they make a heterojunction, with an alloy layer created therebetween. Consequently, the voltage drop at this junction upon application of forward biasing voltage to the baseplate 3 and buffer region 4 is negligible. An n-type silicon baseplate could of course be employed in lieu of the p-type one, and the n-type buffer region 4 could be formed on this n-type silicon baseplate.

The n-type buffer region 4 is a lamination of a first and a second nitride semiconductor layer $L_1$ and $L_2$ arranged alternately a required number of times. The showing of five first nitride semiconductor layers $L_1$ and four second nitride semiconductor layers $L_2$ is by way of example only. It is recommended that the first nitride semiconductor layers $L_1$ be made greater in number than the second nitride semiconductor layers $L_2$ by one, so that the first layer $L_1$ may occupy not only the bottommost, but also the topmost, layer of the buffer region 4.

The first nitride semiconductor layers $L_1$ may have a coefficient of linear expansion intermediate those of the silicon baseplate 3 and the main semiconductor layers 6–8. A small difference in linear expansion coefficient between the first nitride semiconductor layers $L_1$ and the main semiconductor layers 6–8 is conducive to the reduction of cracks and dislocations in the main semiconductor layers 6–8 of nitride semiconductors. Toward this end the first nitride semiconductor layers $L_1$ may be made from, in addition to a dopant, any of the nitrides that can be generally expressed by the following formula:

$$Al_x M_y Ga_{1-x-y} N$$

where M is at least either of indium and boron; x is greater than zero and equal to or less than one; y is equal to or greater than zero and less than one; and the sum of x and y is equal to or less than one.

In short the first nitride semiconductor layers $L_1$ may be made from a nitride containing aluminum at least, examples being aluminum nitride (AlN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN). Perhaps the most desirable of the listed materials for the first nitride semiconductor layers $L_1$ is AlN (x is one in the formula above).

The first nitride semiconductor layers $L_1$ are closer in both lattice constant and thermal expansion coefficient to the silicon substrate 3 than are the second nitride semiconductor layers $L_2$. The first nitride semiconductor layers $L_1$ should preferably be less in lattice constant than the second nitride semiconductor layers $L_2$.

The first nitride semiconductor layers $L_1$ should each be from about 0.5 to about 5.0 nanometers thick. If made less than about 0.5 nanometer thick, the first nitride semiconductor layers $L_1$ would prevent the main semiconductor regions 6-8 from being formed with a desired degree of flatness. If the first nitride semiconductor layers $L_1$ were made more than about 5.0 nanometers thick, on the other hand, the quantum-mechanical tunnel effect would not be obtained. However, the upper limit of the thickness of each first nitride semiconductor layer $L_1$ may be made as high as 50 nanometers in cases the buffer region 4 need not be electrically conductive. Should the first nitride semiconductor layers $L_1$ be each made thicker than 50 nanometers, they might suffer cracks by tensile stresses due both to lattice mismatch between the first and the second nitride semiconductor layers $L_1$ and $L_2$ and to a difference in thermal expansion coefficient between the lowermost first nitride semiconductor layer $L_1$ and the baseplate 3.

The second nitride semiconductor layers $L_2$ are intended for enhancement of the buffering function of the buffer region 4. These layers $L_2$ should be made from n-type nitride semiconductors that either do not contain aluminum or do contain aluminum in a proportion less than that of the aluminum content of the first nitride semiconductor layers $L_1$. The nitrides meeting these requirements are defined as:

where M is at least either of indium and boron; a is equal to or greater than zero and less than one; b is equal to or greater than zero and less than one; the sum of a and b is equal to or less than one; and a is less than the aluminum proportion x in the formula defining the nitrides from which the first nitride semiconductor layers $L_1$ can be made.

Exemplary nitride materials for the second nitride semiconductor layers $L_2$ include GaN, AlInN, AlGaN, AlInGaN, AlBN, AlBGaN, and AlBInGaN. Out of these, the particular nitride employed for the second nitride semiconductor layers $L_2$ in this embodiment of the invention is GaN (a is zero in the formula above). The proportion a of aluminum in any such nitride semiconductor material for the second nitride semiconductor layers $L_2$ should preferably be less than 0.2 in order to keep the second nitride semiconductor layers from cracking. It is also recommended for the same reason that the aluminum proportion a be made less than the aluminum proportion x of the first nitride semiconductor layers $L_1$.

The second nitride semiconductor layers $L_2$ should each be from about 0.5 to about 500 nanometers thick. If made less than about 0.5 nanometer thick, the second nitride semiconductor layers $L_2$ would prevent the overlying first nitride semiconductor layers $L_1$ and the main semiconductor regions 6-8 from being formed with a desired degree of flatness. If the second nitride semiconductor layers $L_2$ were made more than about 500 nanometers thick, on the other hand, cracks might develop as a result of deterioration of the stress mitigating effect by the combination of the first and second nitride semiconductor layers $L_1$ and $L_2$.

In any event the second nitride semiconductor layers $L_2$ should be greater than the first $L_1$. This difference in thickness will be effective to prevent the straining, and consequent cracking, of the first nitride semiconductor layers $L_1$ due both to a difference in lattice constant between the first and the second nitride semiconductor layers $L_1$ and $L_2$ and to a difference in thermal expansion coefficient between the lowermost first nitride semiconductor layer $L_1$ and the baseplate 3.

The first main semiconductor layer 6, or lower confining layer under the active layer 7, is constituted of a first semiconductor portion or basic portion 11 having the interstices or cavities 13 and directly overlying the buffer region 4, and a second semiconductor portion or filler portion 12 filling the interstices or cavities 13 among the basic portion 11 and providing a flat upper surface. As will become apparent from the subsequent disclosure of the fabrication method, the interstices or cavities 13 of the basic portion 11 are irregular in shape and size and may be either continuous or discontinuous.

Both basic portion 11 and filler portion 12 of the first confining semiconductor layer 6 are made from any of the nitride semiconductors that are generally defined as:

where M is at least either of indium and boron; a is equal to or greater than zero and equal to or less than one; b is equal to or greater than zero and less than one; and the sum of a and b is equal to or less than one. Preferred among these nitrides are n-type gallium nitride and compounds based thereon, GaN being particularly preferred.

Figure 1:
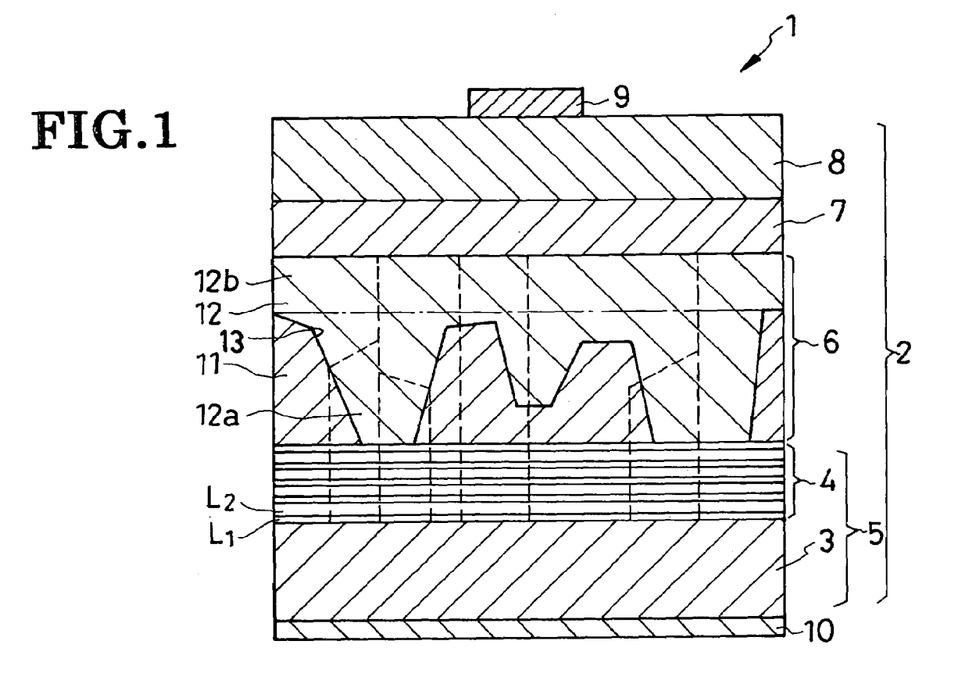
FIG. 1 is a schematic cross section through an LED to be fabricated by the method of this invention.

A closer study of FIG. 1 will reveal that the projections of the basic portion 11 are separated from one another by the interstices or cavities 13 tapering toward the buffer region 4. The filler portion 12 on the other hand is a unitary construction of a first portion $12_a$ and a second portion $12_b$ joined to the first portion $12_a$, which are shown distinguished from each other by the broken line in FIG. 1. The first portion $12_a$ includes downward protuberances engaged with the interstices 13 among the basic portion 11. The second portion $12_b$ is a flat portion or flat top disposed on the first portion $12_a$ and the basic portion 11.

Although the basic portion 11 and filler portion 12 are jointly referred to as the first main semiconductor layer 6 in this embodiment of the invention, only the filler portion 12, or only the flat top or second portion $12_b$ of the filler portion, could be termed the first main semiconductor layer. Use of the first main semiconductor layer 6 as the n-type cladding as in this embodiment is not an essential feature of the invention, either; instead, an n-type cladding could be provided separately on this semiconductor layer 6, which might then be termed either a complementary layer or a buffer layer. More will be said presently about the construction, and method of fabrication, of the semiconductor layer 6.

The active layer or second main semiconductor layer 7 is formed by epitaxially growing a nitride semiconductor on the first main semiconductor layer 6. The nitride semiconductors adoptable for fabrication of the active layer 7 are generally defined as:

$$Al_xIn_yGa_{1-x-y}N$$

where x and y are both equal to or greater than zero and less than one. Indium gallium nitride is employed in this embodiment.

The active layer 7 is shown as a single layer for illustrative convenience. In reality it may take the form of the familiar multiple quantum well structure, although the illustrated single layer construction is also possible. The active layer 7 is not doped with a conductivity type determinant in this embodiment, but in practice may be doped with either a p- or n-type impurity.

The third main semiconductor layer or upper confining layer or p-type cladding 8 is also made from a nitride semiconductor plus a p-type dopant. The nitride semiconductors from which this layer 8 may be made are generally defined as:

$$Al_xIn_yGa_{1-x-y}N$$

where x and y are both equal to or greater than zero and less than one. The third main semiconductor layer 8 is made from p-type GaN to a thickness of 500 nanometers and is transparent.

It will be observed from FIG. 1 that both second and third main semiconductor layers 7 and 8 overlie the flat top of second portion 12$_b$ of the filler portion 12 of the first main semiconductor layer 6. As dislocations are reduced in the filler portion 12 of the first main semiconductor layer 6, so are they in the second and third main semiconductor layers 7 and 8. These layers 7 and 8 are also favorable in flatness.

The anode 9 is mounted centrally on the exposed major surface of the third main semiconductor layer 8, and the cathode 10 is mounted to the underside of the silicon baseplate 3. Alternatively, the anode 9 may be attached to a contact layer, not shown, of p-type nitride semiconductor formed on the third main semiconductor layer 8. Also, the cathode 10 may be connected to the buffer region 4.

Method of Fabrication of the FIG. 1 Device

The fabrication of the FIG. 1 LED 1 started with the preparation of the p-type silicon baseplate 3 having the (111) surface in terms of Miller indices. The baseplate 3 was 500 micrometers thick. Introduced into the organometallic vapor phase epitaxy (OMVPE) reactor, the baseplate 3 was heated to 1170° C. for thermal cleaning. The baseplate 3 was stripped of its oxide coverings by being maintained for ten minutes at that temperature in a hydrogen atmosphere.

Then, after lowering the temperature to 1100° C., one first nitride semiconductor layer $L_1$ of the buffer region 4 was formed by growing a layer of AlN on the baseplate 3 by OMVPE. The AlN layer $L_1$ was formed to a thickness of five nanometers by introducing trimethyl aluminum (TMA), silane (SiH$_4$) and ammonia (NH$_3$) into the reactor. TMA was introduced at a rate of 63 micromoles per minute, SiH$_4$ at 21 nanomoles per minute, and NH$_3$ at 0.14 moles per minute.

Then, for creation of one second nitride semiconductor layer $L_2$, the introduction of TMA was discontinued whereas that of SiH$_4$ and NH$_3$ was continued. Additionally, trimethyl gallium (TMG) was charged into the reactor at 63 micromoles per minute until GaN was layered on the preformed AlN layer $L_1$ to a thickness of 25 nanometers.

The foregoing process of making one first nitride semiconductor layer $L_1$ was repeated twenty-one times, and the process of making one second nitride semiconductor layer $L_2$ was repeated twenty times. Thus, as shown simplified in FIG. 2, the multilayered buffer region 4 was formed on the silicon baseplate 3. Optionally, an additional buffer layer of n-type aluminum indium gallium nitride (AlInGaN) could have been formed by epitaxy between the silicon baseplate 3 and the buffer region 4.

Next came the steps of creating the basic portion 11 on the buffer region 4 according to a feature of the instant invention. A reference back to FIG. 1 will show that the basic portion 11 constitutes in combination with the filler portion 12 the first main semiconductor layer or lower confining layer 6 under the active layer 7. The formation of the basic portion 11 requires the creation of a first layer or first formative layer 21, FIG. 3, and a second layer or second formative layer 22, FIG. 4.

Figure 3:
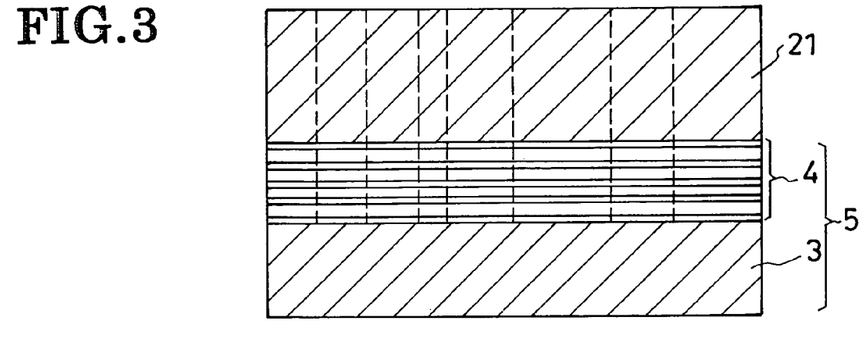
FIG. 3 is a view similar to FIG. 2 but additionally showing a first formative layer formed on the baseplate system in the course of the fabrication of the FIG. 1 LED.

Employed for creation of the first formative layer 21 was one of the nitride semiconductors generally defined by the formula:

$$Al_aM_bGa_{1-a-b}N$$

where M is at least either of indium and boron; a is equal to or greater than zero and equal to or less than one; b is equal to or greater than zero and less than one; and the sum of a and b is equal to or less than one. The nitride semiconductor material in admixture with an n-type dopant was charged into the OMVPE reactor for growing the first formative layer 21 on the topmost first nitride semiconductor layer $L_1$ of the multilayered buffer region 4.

Gallium nitride was the particular substance employed for the first formative layer 21. As at the time of the fabrication of the second nitride semiconductor layers $L_2$ of GaN above, the silicon baseplate 3 was heated to 1100° C., and TMG, SiH$_4$ and NH$_3$ were introduced into the reactor at the rates of 63 micromoles per minute, 21 nanomoles per minute, and 0.14 moles per minute, respectively. The first formative layer 21 of GaN was thus formed to a thickness of 500 nanometers. As indicated by the dashed lines in FIGS. 1 and 3–7, the buffer region 4 had dislocations, which caused dislocations in like positions in the thus-formed first formative layer 21.

Figure 4:
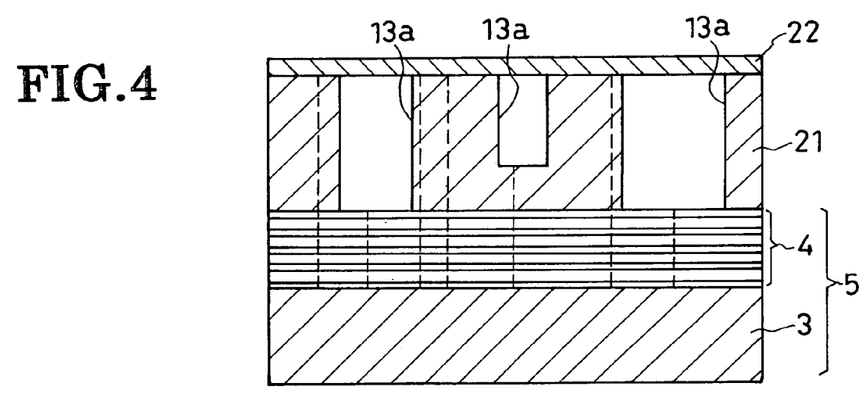
FIG. 4 is a view similar to FIG. 3 but additionally showing a second formative layer formed on the first formative layer, the latter having been intersticed at the early stages of the formation of the second formative layer.

On this first formative layer 21 was then formed by OMVPE the second formative layer 22, FIG. 4, of a nitride semiconductor plus an n-type dopant. The nitride semiconductor materials adoptable for the second formative layer 22 are generally expressed as $$Al_xM_yGa_{1-x-y}N$$

where M is at least either of indium and boron; x is greater than zero and equal to or less than one; y is equal to or greater than zero and less than one; the sum of x and y is equal to or less than one; and x is greater than a in the formula above defining the materials for the first formative layer 21. Aluminum-containing nitrides such as AlN are preferred for the second formative layer 22.

For fabrication of the second formative layer 22 of AlN a gaseous mixture of TMA, SiH$_4$ and NH$_3$ was charged into the OMVPE reactor thereby causing an AlN layer to grow to a thickness of five nanometers on the first formative layer 21. This fabrication of the second formative layer 22 was concurrent with the creation of non-tapering interstices or cavities 13$_a$ in the first formative layer 21 as in FIG. 4 according to a feature of this invention, the non-tapering interstices $13_a$ being later to become the tapering interstices 13 of FIG. 1.

In order to create the non-tapering interstices $13_a$ in the first formative layer 21 at the same time with the fabrication of the second formative layer 22, TMA was charged into the OMVPE reactor at a rate of 6.3 micromoles per minute, which is one tenth of the rate at which TMA was charged as above for fabrication of the first nitride semiconductor layers $L_1$ of the buffer region 4. As a consequence, AlN grew into the second formative layer 22 at one tenth of its growth rate during fabrication of the first nitride semiconductor layers $L_1$. Why the low growth rate of AlN leads to the creation of the non-tapering interstices $13_a$ will become apparent from the following explanation:

With the AlN growth rate made extremely low as above during the fabrication of the second formative layer 22, AlN did not crystallize uniformly, but sparsely, on the surface of the first formative layer 21 during the early stages of fabrication of the second formative layer 22. Parts of the surface of the first formative layer 21 were therefore left uncovered by the deposited AlN during such early stages. These exposed parts of the surface of the first formative layer 21 were subjected to the etching action of the gases within the reactor. The result was the creation of the non-tapering interstices $13_a$ in the first formative layer 21, and the consequent separation of this first formative layer into a multiplicity of discrete or nondiscrete parts, or beads, of irregular shape.

The etching action of the reactor gases proceeded in both thickness direction and lateral direction of the first formative layer 21. The first formative layer 21 of GaN is easier of etching than is the first nitride semiconductor layer $L_1$ of AlN, so much so that the latter practically remained intact in the face of the reactor gases.

With the progress of the epitaxial growth of AlN for the second formative layer 22, AlN grew not only in its thickness direction but laterally too. Thus the growing second formative layer 22 gradually overhung the non-tapering interstices $13_a$ until finally it closed the entrances of all such interstices as in FIG. 4. As will be understood, the interstices $13_a$ and remaining parts of the first formative layer 21 are shown greatly simplified and idealized in FIG. 4 as well as all the subsequent figures; in fact, the interstices and the remnants of the first formative layer were random and irregular in shape and size, as was the thickness of the second formative layer 22.

Figure 5:
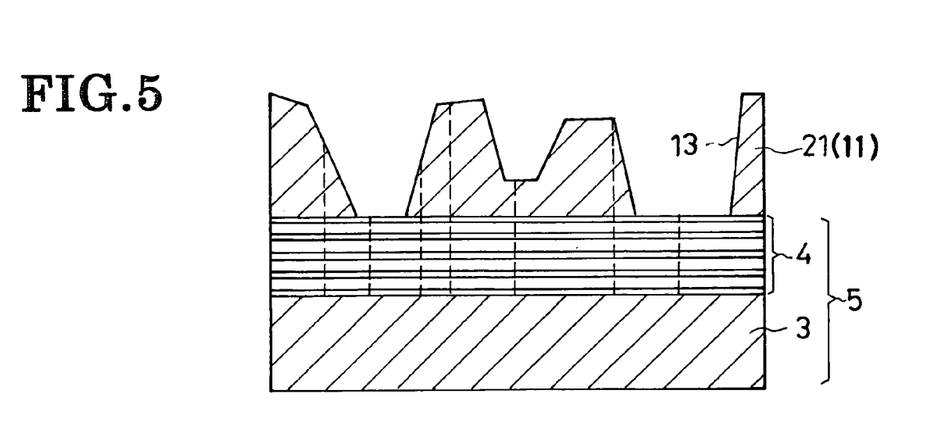
FIG. 5 is a view similar to FIG. 4 except that the second formative layer, not shown in this figure, has been etched away.

The next step was the removal of the second formative layer 22, which was no longer needed, from over the intersticed first formative layer 21. A preferred method to this end is gas etching. The article of FIG. 4 was put to etching treatment for five minutes in the reactor in which the atmosphere was predominantly of hydrogen gas ($H_2$). Not only was the second formative layer 22 removed by this treatment, but also the first formative layer 21 was also etched to redefine the interstices $13_a$ from non-tapering into tapering shape, the tapering interstices being designated 13 in both FIGS. 1 and 5. The reshaped first formative layer 21 as the intersticed first formative layer of FIG. 5 is referred to as the basic portion 11 in relation to FIG. 1. The etching process could have been so modified as to leave parts of the second formative layer 22 on the tops of the remnants of the first formative layer 21 or of the basic portion 11.

Dislocations would not be reduced to a desired degree if the first formative layer 21, later to become the basic portion 11, were too thin. If too thick, however, the first formative layer 21 would develop cracks. Experiment has proved that these troubles are avoidable by making the thickness of the first formative layer 21 from about 100 to about 2000 nanometers, or from about 300 to about 800 nanometers for the best results. The interstices 13 may be formed to a depth ranging from about 50 to about 1000 nanometers.

Figure 6:
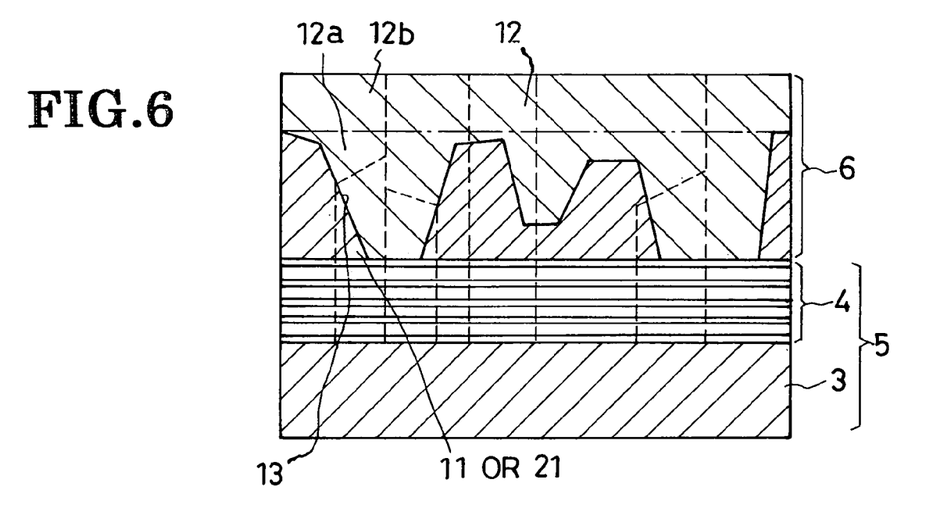
FIG. 6 is a view similar to FIG. 5 but additionally showing a filler portion formed on the intersticed first formative layer in interfitting engagement therewith, the filler portion and first formative layer constituting in combination a first main semiconductor layer of the LED.

Then, as shown in FIG. 6, the third layer or filler portion 12 of the first main semiconductor layer 6 was created on the article of FIG. 5 in interfitting engagement with the basic portion 11. The filler portion 12 as the third layer can be fabricated from any of the nitride semiconductors that are generally expressed as:

$$Al_aM_bGa_{1-a-b}N$$

where M is at least either of indium and boron; a is equal to or greater than zero and equal to or less than one; b is equal to or greater than zero and less than one; and the sum of a and b is equal to or less than one. Any such nitride semiconductor in admixture with an n-type dopant could be processed by OMVPE into the filler portion 12.

However, the material of the filler portion 12 should be the same as that of the basic portion 11 as the intersticed first formative layer. So GaN was employed. The filler portion 12 of n-type GaN was created by heating the silicon baseplate 3 to 1110° C. and charging TMG $SiH_4$, and $NH_3$ into the reactor at the rates of 63 micromoles per minute, 21 nanomoles per minute, and 0.28 mole per minute, respectively.

The rate of $NH_3$ introduction into the reactor for fabrication of the filler portion 12 was made approximately twice as high as that for fabrication of the second nitride semiconductor layers $L_2$. The lateral growth rate of GaN was therefore faster during the fabrication of the filler portion 12 than during that of the second nitride semiconductor layers $L_2$. The growth of GaN in a direction normal to the baseplate 3, with concurrent lateral growth at the higher rate, resulted in a diminution in dislocation density as the filler portion 12 grew up, for the reasons set forth in the Japanese patent applications cited earlier in this specification. The density of the dislocations extending through the upper part of the filler portion 12 in a direction normal to the baseplate 3 was as low as $1 \times 10^9$ cm$^{-2}$, compared with $1 \times 10^{10}$ cm$^{-2}$ in the first formative layer 21 or basic portion 11.

As has been described with reference to FIG. 1, the filler portion 12 thus formed as in FIG. 6 is constituted of the protuberances or first portion $12_a$ filling the interstices 13 among the basic portion 11, and the flat top or second portion $12_b$ from which depend the protuberances $12_a$. About 200 nanometers thick, the flat top $12_b$ with its reduced dislocation density lends itself to use as an n-type semiconductor layer of the LED 1.

Figure 7:
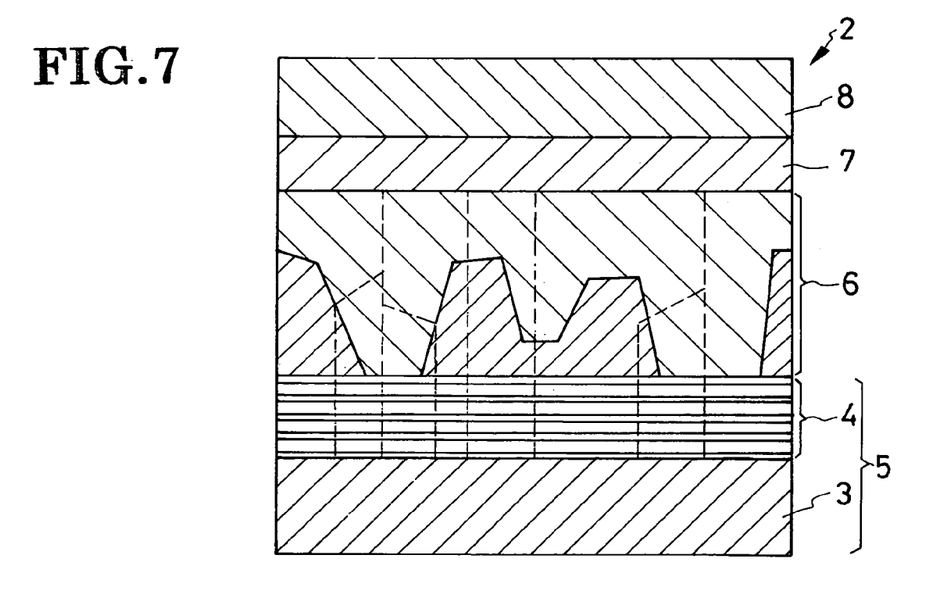
FIG. 7 is a view similar to FIG. 6 but additionally showing a second and a third main semiconductor layer formed on the first main semiconductor layer.

The next step was the creation of the active layer or second main semiconductor layer 7 of the known multiple quantum well design on the first main semiconductor layer 6 as in FIG. 7. Although depicted as a single layer in both FIGS. 1 and 7, the active layer 7 was in fact constituted of alternating four barrier layers and four well layers.

The second main semiconductor layer 7 was made immediately after the creation of the filler portion 12 of the first main semiconductor layer 6. Following the cessation of gas introduction into the reactor for fabrication of the filler portion 12, the silicon baseplate was allowed to cool down to 800° C. Then TMG, trimethyl indium (TMI) and $NH_3$ were introduced into the reactor in prescribed proportions thereby creating a barrier layer of $In_{0.02}Ga_{0.98}N$ to a thickness of 13 nanometers. Then only the proportion of TMI was altered to create a well layer of $In_{0.2}Ga_{0.8}N$ to a thickness of three nanometers. The fabrication of these barrier layer and well layer was repeated four times to complete the second main semiconductor layer 7 of multiple quantum well configuration. The thus formed second main semiconductor layer 7 was favorable in crystallinity by virtue of the favorable crystallinity of the underlying filler portion 12 of the first main semiconductor layer 6. The second main semiconductor layer 7 could have been doped with a p- or n-type impurity.

As shown also in FIG. 7, the third main semiconductor layer 8 was then formed on the second 7. To this end the temperature of the silicon baseplate 3 was raised to 1110° C. following the creation of the second main semiconductor layer 7. Then TMG, NH$_3$ and bis-cyclo pentadienyl magnesium (hereinafter referred to as CPMg) were charged into the reactor thereby creating on the second main semiconductor layer 7 the third main semiconductor layer 8 of p-type GaN to a thickness of about 500 nanometers. Introduced to a concentration of $3\times10^{18}$ cm$^{-3}$, Mg functioned as p-type impurity.

Now was completed the LED body or LED substrate system 2 as in FIG. 7. The LED 1 of FIG. 1 was subsequently made by forming the electrodes 9 and 10 on the substrate system 2 by vacuum vapor deposition.

What follows is a list of advantages gained by the above described method of this invention:

1. The flat top or second portion $12_b$ of the filler portion 12 of the first main semiconductor layer 6, and the second and third main semiconductor layers 7 and 8, are all less in dislocation density and better in flatness than heretofore. As a result, the output intensity of the LED manufactured by the method of this invention is approximately one and a half times as high as that of the device taught by Japanese Unexamined Patent Publication No. 2003-59948, supra, at a wavelength of 470 nanometers and an interelectrode current of 20 milliamperes.

2. The reverse current leakage of the LED according to the invention is one tenth of that of the device according to Japanese Unexamined Patent Publication No. 2003-59948 thanks to the noted reduction of dislocation density.

3. The manufacturing process of the LED according to the invention is much simpler and less costly than heretofore as the basic portion 11 is formed from the two formative layers 21 and 22, as in FIGS. 3–5, in the same reactor as used for fabrication of the buffer region 4, the filler portion 12 of the first main semiconductor layer 6, and the second and third main semiconductor layers 7 and 8.

4. The possible warpage of the two-inch-diameter LED wafer is as little as 10 micrometers, so that the production of defective products is greatly curtailed during the photographic process for LED manufacture.

5. The buffer region 4 and first main semiconductor layer 6 contribute in combination toward improvement of the crystallinity and flatness of the second and third main semiconductor layers 7 and 8.

Figure 8:
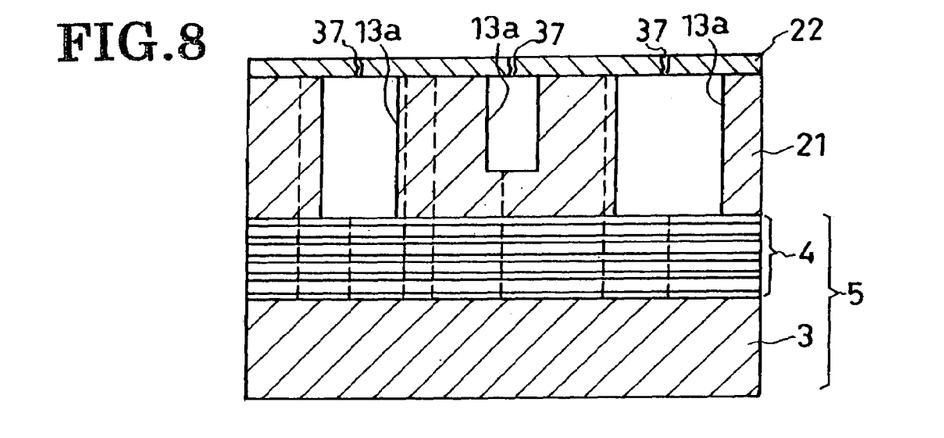
FIG. 8 is a view similar to FIG. 4 but explanatory of a slight modification of the foregoing method.

Method of FIG. 8

FIG. 8 is explanatory of a slight modification of the above described method. This modified method is similar to that of FIGS. 1–7 insofar as the first formative layer 21 is produced by epitaxial growth of GaN on the baseplate system 5. Then the second formative layer 22 is formed on the first formative layer 21 by epitaxial growth of an aluminum-containing nitride semiconductor such as AlN. This aluminum-containing nitride semiconductor may have a growth rate that is either the same as, or lower than, that of the aluminum-containing nitride semiconductor for the first nitride semiconductor layers $L_1$ of the buffer region 4.

The particular substances employed for fabrication of the second formative layer 22 were TMA, SiH$_4$ and NH$_3$. The second formative layer 22 thus formed in the reactor had a multiplicity of microcracks indicated explanatorily at 37 in FIG. 8. As has been stated in connection with FIG. 4, cavities or depressions were formed in the first formative layer 21 by etching action during the fabrication of the second formative layer 22, but not necessarily to desired depths. Therefore, in this alternative method, thermal posttreatment was employed after the introduction of TMA, SiH$_4$ and NH$_3$ into the reactor had been discontinued upon creation of the second formative layer 22. After thus terminating the epitaxial growth, the reactor temperature was maintained at 1100° C. for the thermal posttreatment. A hydrogen gas atmosphere could have been adopted for this posttreatment.

The 1100° C. posttreatment caused the first formative layer 21 of GaN to be exposed to the reactor atmosphere via the microcracks 37 in the second formative layer 22. The result was the dissociation of nitrogen from gallium in the first formative layer 21 and, in consequence, the creation or enlargement of numerous interstices $13_a$ in the first formative layer 21 as in FIG. 8. The posttreatment was continued until the interstices $13_a$ of desired size and depth were completed, with some of them extending down to the surface of the buffer region 4 as shown.

Then the second formative layer 22 was thoroughly removed by gas etching to obtain an article similar to that of FIG. 5, although it could be partly left on the undepressed surface of the first formative layer 21. Then the filler portion 12 of the first main semiconductor layer 6 was fabricated as in FIG. 6 by epitaxial growth of the same gallium-containing nitride semiconductor as that used for the first formative layer 21. This alternate method offers the same advantages as does the first disclosed method.

Figure 9:
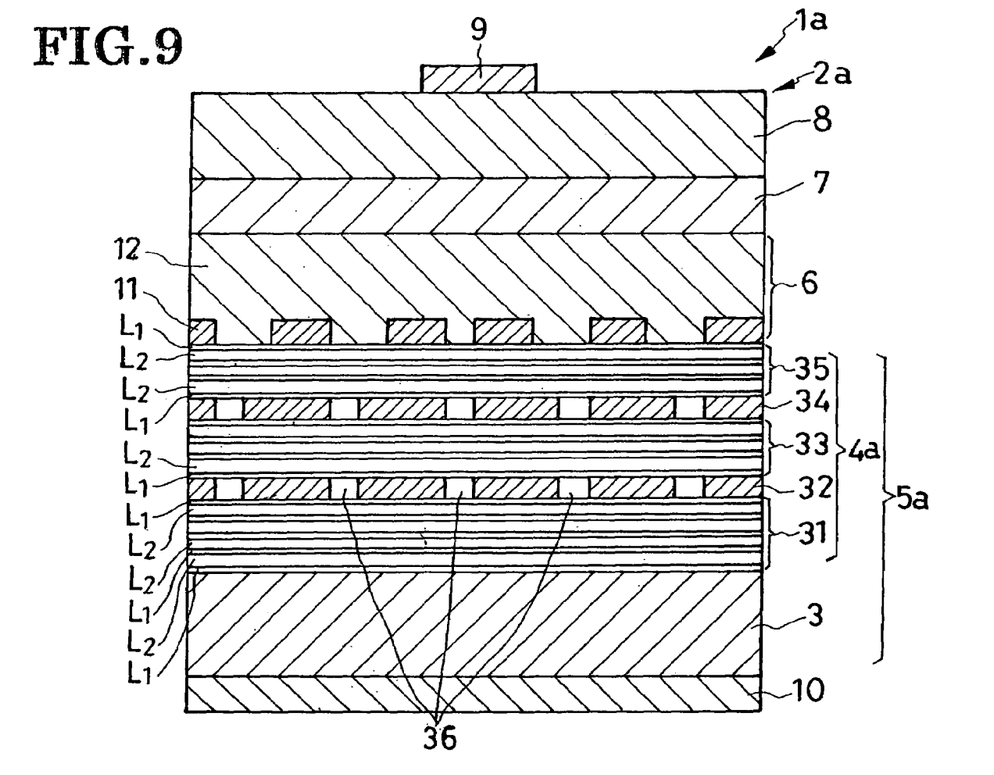
FIG. 9 is a schematic cross section through another preferred form of LED to be fabricated by the method of this invention.

Method of FIG. 9

This method is directed to the fabrication of a modified LED $1_a$ shown in FIG. 9. The modified LED $1_a$ has a modified LED body or LED substrate system $2_a$ having a modified buffer region $4_a$. All but this modified buffer region $4_a$ of the LED substrate system $2_a$ is similar to the substrate system 2 of FIG. 1. The baseplate 3 and modified buffer region $4_a$ constitute in combination the baseplate system $5_a$ on which are formed the three main semiconductor layers 6–8.

The modified buffer region $4_a$ has five buffer layers 31–35 laminated one on top of another in that order from the lowermost one upward. Of these five buffer layers 31–35, the three 31, 33 and 35 are similar in organization to the buffer region 4 of the FIG. 1 LED 1, each being a lamination of alternating nitride semiconductor sublayers $L_1$ and $L_2$. These three buffer layers 31, 33 and 35 will therefore be hereinafter referred to as the first, the second and the third laminated buffer layers, respectively.

Interposed between the first and second laminated buffer layers 31 and 33, the buffer layer 32 is not laminated but contains a multiplicity of interstices 36. The remaining one buffer layer 34 between the third and fifth laminated buffer layers 33 and 35 likewise contains a multiplicity of interstices. These layers 32 and 34 will therefore be hereinafter referred to as the first and the second intersticed buffer layers, respectively, in contradistinction from the three laminated buffer layers 31, 33 and 35. The intersticed buffer layers 32 and 34 are conducive to the prevention of the warping of the LED body or LED substrate system $2_a$ and to the mitigation of stresses imposed upon on the three main semiconductor layers 6–8.

The two intersticed buffer layers 32 and 34 can be fabricated from any of the nitride semiconductors that are generally expressed as:

where M is at least either of indium and boron; a is equal to or greater than zero and equal to or less than one; b is equal to or greater than zero and less than one; and the sum of a and b is equal to or less than one. An n-type dopant may be added to any such compound. Exemplary compounds for the intersticed buffer layers 32 and 34 include GaN, InGaN, AlInN, AlGaN, and AlInGaN.

In cases where the intersticed buffer layers 32 and 34 contain aluminum, the aluminum proportion in each such layer should be made less than that of the first nitride semiconductor sublayers $L_1$. It is also desired that the etching rate of the intersticed buffer layers 32 and 34 during the vapor phase growth be higher than that of the first nitride semiconductor sublayers $L_1$.

The thicker the intersticed buffer layers 32 and 34 are, the better will they serve the purpose of stress mitigation. However, the overlying first nitride semiconductor sublayers $L_1$ would suffer in flatness if the intersticed buffer layers 32 and 34 were too thick. The thickness of each of these layers 32 and 34 should therefore be in the range of from about 5 to about 5000 nanometers, or from about 50 to about 250 nanometers for the best results. The interstices 36 may be formed to any depths not exceeding the depth of the buffer layers 32 and 34, and be from about five to about 5000 nanometers in the diameter of their upper ends.

The intersticed buffer layers 32 and 34 may be first fabricated in uninstersticed form in the same OMVPE reactor following the epitaxial growth of the first and second laminated buffer layers 31 and 33, respectively. These yet-uninstersticed buffer layers 32 and 34 are each to be intersticed as the lowermost nitride semiconductor sublayer $L_1$ of the overlying laminated buffer layer 33 or 35 is formed subsequently. Let us study by way of example how the first yet-uninstersticed buffer layer 32 is intersticed during the subsequent fabrication of the immediately overlying nitride semiconductor sublayer $L_1$, it being understood that the second yet-uninstersticed buffer layer 34 is intersticed in a like fashion.

After the creation of the first yet-uninstersticed buffer layer 32 on the first laminated buffer layer 31, the lowermost first nitride semiconductor sublayer $L_1$ of the second laminated buffer layer 33 is formed on the first yet-uninstersticed buffer layer 32. To this end a gaseous mixture of TMA, $SiH_4$ and $NH_3$ may be introduced into the OMVPE reactor until AlN is epitaxially grown into the first nitride semiconductor sublayer $L_1$ with a thickness of five nanometers. Particularly important is the rate of introduction of TMA, which in this case is 6.3 micromoles per minute, or one tenth of the rate of TMA introduction for fabrication the first nitride semiconductor sublayers $L_1$ other than the one immediately overlying the buffer layer 32. The growth rate of the first nitride semiconductor sublayer $L_1$ immediately overlying the buffer layer 32 is one tenth of that of the other first nitride semiconductor sublayers $L_1$.

With the growth rate of the immediately overlying first nitride semiconductor sublayer $L_1$ made as low as above, AlN does not crystallize uniformly on the surface of the yet-uninstersticed buffer layer 32 of GaN in the early formative stages of the first nitride semiconductor sublayer $L_1$, leaving that surface partly exposed. Such exposed surface parts of the yet-uninstersticed buffer layer 32 are subjected to the etching action of the reactor gases, with the consequent creation of interstices 36. The etching action proceeds both normal and parallel to the plane of the buffer layer 32 (now intersticed). The underlying first nitride semiconductor sublayer $L_1$, which is of AlN, is etched much more slowly than the intersticed buffer layer 32 of GaN and so substantially remains unaffected by the etching action.

The epitaxial growth of AlN into the first nitride semiconductor sublayer $L_1$ on the first intersticed buffer layer 32 is to be continued after the creation of the interstices 36 in that layer 32. The AlN will grow not only in a direction away from the first intersticed buffer layer 32 but in a direction parallel to its surface, too, so that the first nitride semiconductor sublayer $L_1$ will finally be created which completely closes the interstices 36 in the underlying first intersticed buffer layer 32. The interstices 36 are also shown greatly simplified and idealized in FIG. 9; in practice, they will be created at random and without any regularity.

Figure 10A:
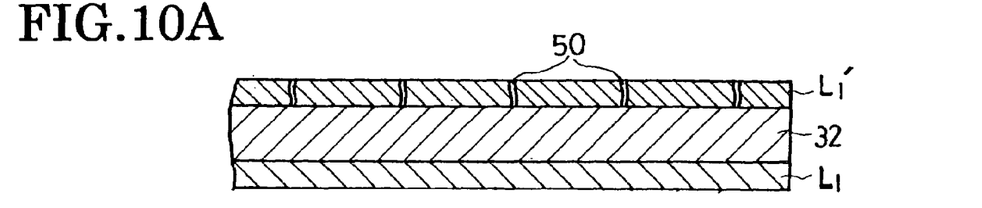
FIG. 10A is a cross sectional view showing part of the buffer region of an LED similar to that of FIG. 9, in order to explain a modified method of creating interstices in the required layers of the buffer region.
Figure 10B:
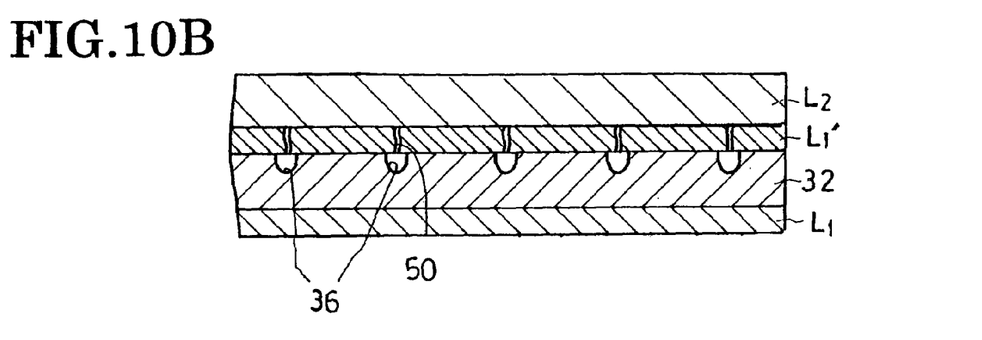
FIG. 10B is a view similar to FIG. 10A except that the interstices are shown created in one of the buffer layers.

Method of FIGS. 10A & 10B

FIGS. 10A and 10B are explanatory of a modified method of creating the intersticed buffer layers similar to those shown at 32 and 34 in FIG. 9. FIG. 10A shows one yet-uninstersticed buffer layer 32 of gallium-containing nitride semiconductor formed to a thickness of five to 5000 nanometers on the topmost first nitride semiconductor sublayer $L_1$ of the underlying laminated buffer layer (shown at 31 in FIG. 9). GaN is a preferred material for the buffer layer 32. Then the bottommost first nitride semiconductor sublayer $L_1'$ of another laminated buffer layer (shown at 33 in FIG. 9) is formed in overlying relationship to the yet-uninstersticed buffer layer 32. This overlying first nitride semiconductor sublayer $L_1'$ can be of the same material as the underlying first nitride semiconductor sublayer $L_1$. The growth rate of the overlying first nitride semiconductor sublayer $L_1'$ may be either less than or equal to that of the underlying first nitride semiconductor sublayer $L_1$.

Formed by introduction of a gaseous mixture of TMA, $SiH_4$ and $NH_3$ into the reactor, the overlying first nitride semiconductor sublayer $L_1'$ will contain microcracks 50 (similar microcracks in the underlying sublayer $L_1$ are not shown because of their impertinence to the topic under consideration). As has been stated in conjunction with FIG. 9, the buffer layer 32 will be intersticed during the fabrication of the overlying first nitride semiconductor sublayer $L_1'$, but not necessarily to the required dimensions. For enlargement of the possibly undersized interstices, the reactor temperature may be maintained at 1100° C. upon completion of the epitaxial growth of the overlying first nitride semiconductor sublayer $L_1'$, that is, upon termination of the introduction of TMA, $SiH_4$ and $NH_3$ into the reactor. A hydrogen gas atmosphere may be adopted for this heat treatment.

The incompletely intersticed GaN buffer layer 32 will be exposed during the heat treatment to the reactor atmosphere via the microcracks 50 in the overlying first nitride semiconductor sublayer $L_1'$. The result again will be the dissociation of nitrogen from gallium in the buffer layer 32 and, in consequence, the creation or enlargement of numerous interstices 36 in that layer 32 as in FIG. 10B. The heat treatment may be continued until the interstices 36 of desired size and depth are created. Then, as indicated also in FIG. 10B, the gallium-containing second nitride semiconductor sublayer $L_2$ may be formed on the first nitride semiconductor sublayer $L_1'$.

The above described method of FIG. 9 and its modification shown in FIGS. 10A and 10B possess the following advantages in addition to all those listed for that of FIGS. 1–7:

1. The intersticed buffer layers 32 and 34 greatly reduce the warpage of the LED substrate system $2_a$ or the wafer for the LED substrate system $2_a$. The warpages of five-inch wafers for the LED substrate system $2_a$ of the FIG. 9 construction have been all found less than 50 micrometers, drastically less than that of the similar wafers according to the noted Japanese Unexamined Patent Publication No. 2003-59948. The reduced wafer warpage leads to the production of significantly less defective units in photolithographic and other manufacturing processes of the LED.

2. Dislocations are greatly reduced which extend from the silicon baseplate 3 all the way up to the surface of the main semiconductor layer 8.

3. The surface of the main semiconductor layer 8 is better in flatness than that of Japanese Unexamined Patent Publication No. 2003-59948, supra, and free from cracks.

4. The LED manufactured by the FIG. 9 method is approximately two times as high in output intensity as the device taught by Japanese Unexamined Patent Publication No. 2003-59948 at a wavelength of 470 nanometers, an interelectrode current of 20 milliamperes, and an a voltage of 3.4 volts.

5. The alternating laminated buffer layers 31, 33 and 35 and intersticed buffer layers 32 and 34 reduces wafer warpage to a minimum and improves surface flatness and crystallinity.

6. The intersticed buffer layers 32 and 34 are fabricated by the same reactor as the other constituent layers or regions of the LED.

Figure 11:
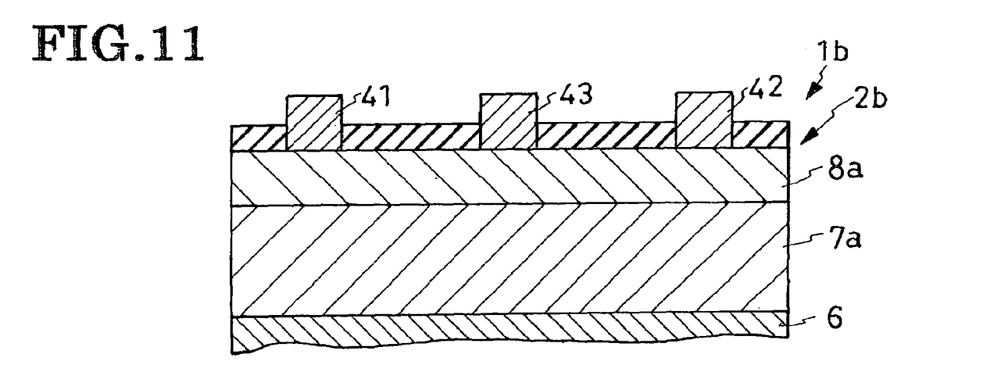
FIG. 11 is a fragmentary cross section through a HEMT capable of fabrication by the method of this invention.

Method of FIG. 11

The method of this invention may be applied to the production of a HEMT shown fragmentarily in FIG. 11 and therein generally labeled $1_b$. The LED body or LED substrate system $2_b$ of the HEMT $1_b$ has an electron transit layer $7_a$ and electron supply layer $8_a$ in places of the main semiconductor layers 7 and 8 of the FIG. 1 LED substrate system 2, the other details of construction being identical for both substrate systems 2 and $2_b$. The electron transit layer $7_a$ and electron supply layer are both grown epitaxially on the first main semiconductor layer 6 formed by the same method as its FIG. 1 counterpart.

The electron transit layer $7_a$ is made from undoped GaN to a thickness of 500 micrometers. The electron supply layer is made from n-type $Al_{o.2}Ga_{0.8}N$, doped with Silicon, to a thickness of 30 nanometers. The electron supply layer supplies to the electron transit layer $7_a$ the electrons generated by the n-type donor impurities. The HEMT chip $2_b$ is provided with a source 41, drain 42 and gate 43 to be completed into the HEM $1_b$. Both source 41 and drain 42 make ohmic contact with the electron supply layer $8_a$ whereas the gate 43 makes Schottkey contact with the electron supply layer. The source 41 and drain 42 could be connected to the electron supply layer $8_a$ via a contact layer of high n-type impurity concentration.

The HEMT $1_b$ is capable of fabrication by the same method as the LED 1 of FIG. 1, with the same advantages as those listed with reference to FIGS. 1–7.

Notwithstanding the foregoing detailed disclosure it is not desired that the present invention be limited by the exact showing of the drawings or the description thereof. A variety of modifications, alterations or adaptations of the invention will appear to the specialists without departing from the scope of the invention. For example, the method of the invention may be applied to the production of FETs, rectifier diodes and various other semiconductor devices in addition to LEDs and HEMTs. All the layers in all the illustrated embodiments might be reversed in conductivity type. It is therefore appropriate that the invention be construed broadly and in a manner consistent with the fair meaning or proper scope of the claims which follow.

What is claimed is:

1. A method of making a substrate system for fabrication of a semiconductor device, which comprises:
    (a) providing a baseplate;
    (b) forming a first layer on the baseplate by growing by vapor-phase epitaxy a gallium-nitride-based compound semiconductor containing aluminum in a first proportion which is equal to or greater than zero;
    (c) forming a second layer on the first layer by growing by vapor-phase epitaxy a nitride semiconductor containing aluminum in a second proportion which is greater than the first proportion, with substantially concurrent creation of interstices in the first layer;
    (d) removing at least part of the second layer from over the first layer; and
    (e) forming a third layer on the first layer by growing a gallium-nitride-based compound semiconductor by vapor-phase epitaxy, the third layer being constituted of a first portion filling the interstices in the first layer and of a second portion joined to the first portion.

2. The method of claim 1 wherein the second layer is grown at a lower rate than the first layer.

3. The method of claim 1 wherein the third layer is grown in an atmosphere containing nitrogen at a higher density than that during the growth of the first layer.

4. The method of claim 1 wherein the baseplate is made from either of silicon, silicon compound, zinc oxide, neodymium gallium oxide, group III–V compound semiconductors, and sapphire.

5. The method of claim 1 further comprising a step of creating a buffer region on the baseplate, the first layer being formed on the buffer layer.

6. The method of claim 5 wherein the buffer region includes a buffer layer on which is formed the first layer, the buffer layer being made from a nitride semiconductor containing aluminum in a proportion greater than the first proportion.

7. The method of claim 5 wherein the buffer region includes an intersticed buffer layer.

8. The method of claim 1 further comprising a step of creating a fourth layer on the third layer by growing by vapor-phase epitaxy a nitride semiconductor different from the material of the third layer.

9. The method of claim 1 wherein the first and the third layer are both made from a nitride semiconductor defined as:

where M is at least either of indium and boron; a is equal to or greater than zero and equal to or less than one; b is equal to or greater than zero and less than one; and the sum of a and b is equal to or less than one;

and wherein the second layer is made from a nitride semiconductor defined as:

$Al_xM_yGa_{1-x-y}N$ where M is at least either of indium and boron; x is greater than zero, equal to or less than one, and greater than a in the formula of nitride semiconductors for the first and the third layer; y is equal to or greater than zero and less than one; and the sum of x and y is equal to or less than one.

10. The method of claim 9 wherein the buffer region includes a buffer layer on which is formed the first layer, the buffer layer being made from a nitride semiconductor that is defined as:

$Al_xM_yGa_{1-x-y}N$ where M is at least either of indium and boron; x is greater than zero, equal to or less than one, and greater than a in the formula of nitride semiconductors for the first and the third layer; y is equal to or greater than zero and less-than one; and the sum of x and y is equal to or less than one.

11. A method of making a substrate system for fabrication of a semiconductor device, which comprises:
   (a) providing a baseplate;
   (b) forming a first layer on the baseplate by growing by vapor-phase epitaxy a gallium-nitride-based compound semiconductor containing aluminum in a first proportion which is equal to or greater than zero;
   (c) forming a microcracked second layer on the first layer by growing by vapor-phase epitaxy a nitride semiconductor containing aluminum in a second proportion which is greater than the first proportion, with substantially concurrent creation of interstices in the first layer by etching action through the microcracks in the second layer;
   (d) removing at least part of the second layer from over the first layer; and
   (e) forming a third layer on the first layer by growing a gallium-nitride-based compound semiconductor by vapor-phase epitaxy, the third layer being constituted of a first portion filling the interstices in the first layer and of a second portion joined to the first portion.

12. The method of claim 11 wherein the interstices in the first layer are completed by thermal posttreatment following the creation of the microcracked second layer.

13. A method of making a substrate system for fabrication of a semiconductor device, which comprises:
   (a) placing a baseplate in a reactor;
   (b) forming a first formative layer on the baseplate in the reactor by growing by vapor-phase epitaxy a gallium-nitride-based compound semiconductor containing aluminum in a first proportion which is equal to or greater than zero;
   (c) forming a second formative layer on the first formative layer in the reactor by growing by vapor-phase epitaxy a nitride semiconductor containing aluminum in a second proportion which is greater than the first proportion, with substantially concurrent creation of interstices in the first formative layer by etching action of gases within the reactor;
   (d) etching away at least part of the second formative layer from over the intersticed first formative layer in the reactor; and
   (e) forming a filler portion on the intersticed first formative layer in interfitting engagement therewith by growing a gallium-nitride-based compound semiconductor by vapor-phase epitaxy in the reactor.

* * * * *